United States Patent
Rosenfeld et al.

(10) Patent No.: US 6,405,792 B1
(45) Date of Patent: Jun. 18, 2002

(54) COMPACT FLUID TO FLUID HEAT EXCHANGER

(75) Inventors: John H. Rosenfeld; Mark T. North, both of Lancaster, PA (US)

(73) Assignee: Thermal Corp., Wilmington, DE (US)

( * ) Notice: Subject to any disclaimer, the term of this patent is extended or adjusted under 35 U.S.C. 154(b) by 0 days.

(21) Appl. No.: 09/911,762

(22) Filed: Jul. 24, 2001

(51) Int. Cl.[7] .............................................. F28D 21/00
(52) U.S. Cl. ...................................... 165/164; 165/907
(58) Field of Search ............................... 165/164, 170, 165/907, 168

(56) References Cited

U.S. PATENT DOCUMENTS

| | | | |
|---|---|---|---|
| 3,364,951 A | 1/1968 | Burne et al. | 165/130 |
| 4,478,276 A | * 10/1984 | Rosenbaum et al. | 165/164 |
| 4,516,632 A | 5/1985 | Swift et al. | 165/167 |
| 5,002,122 A | 3/1991 | Sarraf et al. | 165/104.26 |
| 5,205,353 A | 4/1993 | Willemsen et al. | 165/170 |
| 5,267,611 A | 12/1993 | Rosenfeld | 165/168 |
| 5,727,618 A | 3/1998 | Mundinger et al. | 165/80.4 |
| 6,131,650 A | 10/2000 | North et al. | 165/170 |

OTHER PUBLICATIONS

J.H. Rosenfeld and M.T. North, "Porous Media Heat Exchangers for Cooling of High–power Optical Components", Optical Engineering, vol. 34, No. 2, pp 335 (Feb. 1995).

J.H. Rosenfeld, J.E. Lindemuth, M.T. North, and R.H. Goulding, "Innovative Technologies For Faraday Shield Cooling", 16th IEEE/NPSS Symposium, Oct. 1, 1995.

* cited by examiner

Primary Examiner—Allen Flanigan
(74) Attorney, Agent, or Firm—Duane Morris LLP

(57) ABSTRACT

The disclosure is for an easily assembled heat exchanger using an internal porous metal pad. The heat exchanger is constructed of two halves attached at their heat transfer surfaces. Each half includes a pan shaped casing, a pad of sintered porous metal, a manifold block with channels, and a lid. The porous pad is mounted between the heat transfer surface of the casing and the manifold. The lid includes input and output fluid holes which are connected to sets of alternating channels in the manifold block, so that adjacent channels are isolated from each other and are connected to only either the input or the output holes so that the fluid must flow through the pad. An alternative embodiment has the casings of the two halves formed as a single part.

14 Claims, 5 Drawing Sheets

COMPACT FLUID TO FLUID HEAT EXCHANGER

BACKGROUND OF THE INVENTION

This invention deals generally with heat exchangers and more specifically with a compact fluid to fluid heat exchanger.

Typical heat exchangers use thermal conduction through metal structures with a structure exposed to heat from a fluid on one side of a surface and with a cooling fluid on the other side of the surface.

Cooling a high power density heat exchanger surface, that is, a surface through which intense heat is being transferred, is a particularly difficult problem. If the heat is delivered to a heat exchanger surface in multiple locations, or generally across the entire surface, the heat removal must similarly be over the entire surface. In the simplest configurations, such as with liquids flowing through cooling pipes attached to the opposite sides of a heat exchanger plate, just the thermal resistance through the heat exchanger plate, between the heat input fluid and the heat removal fluid, can permit the temperature of the hotter fluid to rise too high.

Even with the use of evaporation on the cooler side it is difficult to accomplish a small temperature difference in such a heat exchanger. One reason is that high heat input at one location can create a high vapor pressure at that point and prevent additional liquid from reaching that location for generation of additional cooling vapor. Such a situation can lead to failure of the heat exchange action.

Although there have been some approaches to cooling a heated surface without the use of evaporation, they also have not proven entirely satisfactory. U.S. Pat. No. 5,727,618 by Mundinger et al suggests one typical approach for cooling a high power density surface of a laser diode array. That patent discloses channels in a solid plate adjacent to the heated surface. U.S. Pat. No. 5,205,353 by Willemsen et al discloses alternating complimentary wedge shaped channels formed in a porous layer, with fluid fed into every other channel and out the channels between the input channels.

Such channeled designs suffer from several shortcomings. Those with solid channels such as Mundinger et al are easier to manufacture, but only directly cool the portions of the heated surface in contact with the fluid channels. The balance of the heated surface must conduct heat through the heated structure to reach the portions in contact with the fluid in the same manner as is required for attached pipes.

Those designs such as Willemsen et al, which have channels in porous materials, are difficult and expensive to manufacture. Furthermore, they only supply a limited quantity of additional fluid in contact with the heated surface. They only add the cooling fluid flowing through the portion of the porous layer in direct contact with the heated surface to the amount which would be supplied by channels in adjacent solid material. Fluid passing through the porous material only a small distance removed from the heated surface adds little to the heat transfer from the heated surface.

It would be very advantageous to have a heat exchanger which supplies heated and cooled fluid to the entire surface on both sides of the heat transfer structure and yet was simple to manufacture.

SUMMARY OF THE INVENTION

The invention is an easily assembled heat exchanger using an internal porous metal pad. The heat exchanger is constructed of two halves each with only four simple parts. Each half includes a cup shaped casing, a pad of sintered porous metal, a manifold block with channels, and a lid. Each lid includes input and output fluid holes which are connected to sets of alternating channels in the manifold block, so that adjacent channels are isolated from each other and are connected to only either the input or the output holes. Thus, the only access between the adjacent input and output channels is through the sintered metal wick which is sandwiched between the manifold block and the bottom of the casing. Fluid flow through the wick thereby affects the bottom of the casing which is held in heat conducting contact with an exact duplicate half so that heat transfer occurs between the liquids flowing in both halves. Another embodiment simply uses a single bottom piece with the two halves attached to opposite surfaces of the bottom.

DETAILED DESCRIPTION OF THE INVENTION

Figure 1:
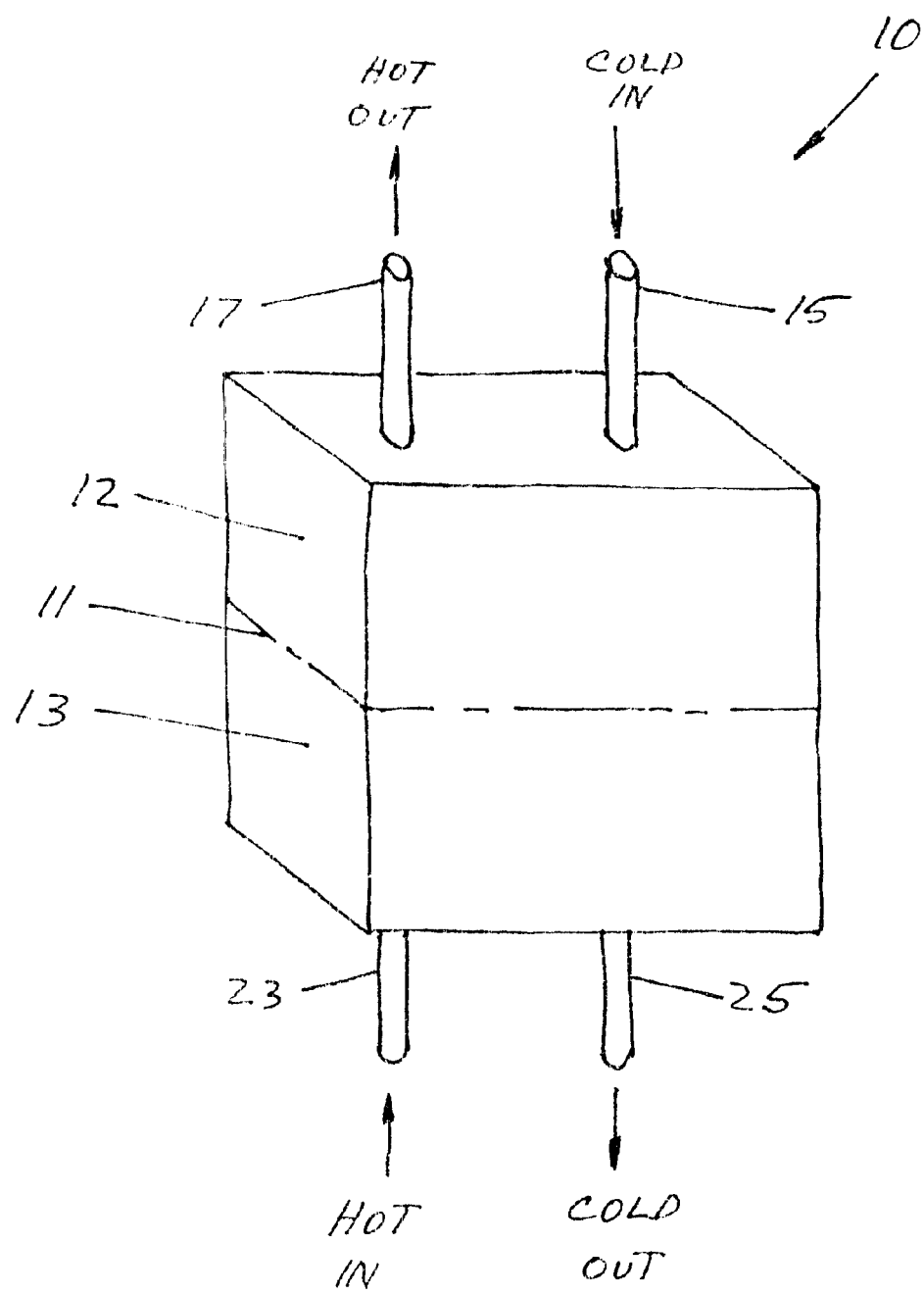
FIG. 1 is a perspective exterior view of the preferred embodiment of the invention.

FIG. 1 is a perspective exterior view of heat exchanger 10 of the preferred embodiment of the invention in which pan 12 of one half of heat exchanger 10 is attached to pan 13 of the second half of heat exchanger 10 at center plane 11. Pipe 15 supplies cold liquid to the half of heat exchanger 10 within pan 12, and the liquid leaves pan 12 through pipe 17 after being heated by heat transferred from the liquid in pan 13 of the second half of heat exchanger 10. The heat is put into the second half of heat exchanger 10 within pan 13 by hot liquid flowing into pipe 23. The heat from this hot liquid is transferred to the cold liquid flowing within pan 12, and the liquid leaving pan 13 from pipe 25 is then cold. The transfer of heat is explained in the subsequent discussions in regard to FIG. 2 and FIG. 3. However, it should be appreciated that the basic purpose of heat exchanger 10 can either be to cool the liquid flowing through pan 13 or to heat the liquid flowing through pan 12. Furthermore, since the two halves of heat exchanger 10 are identical, either half can be used for the heat input.

Figure 2:
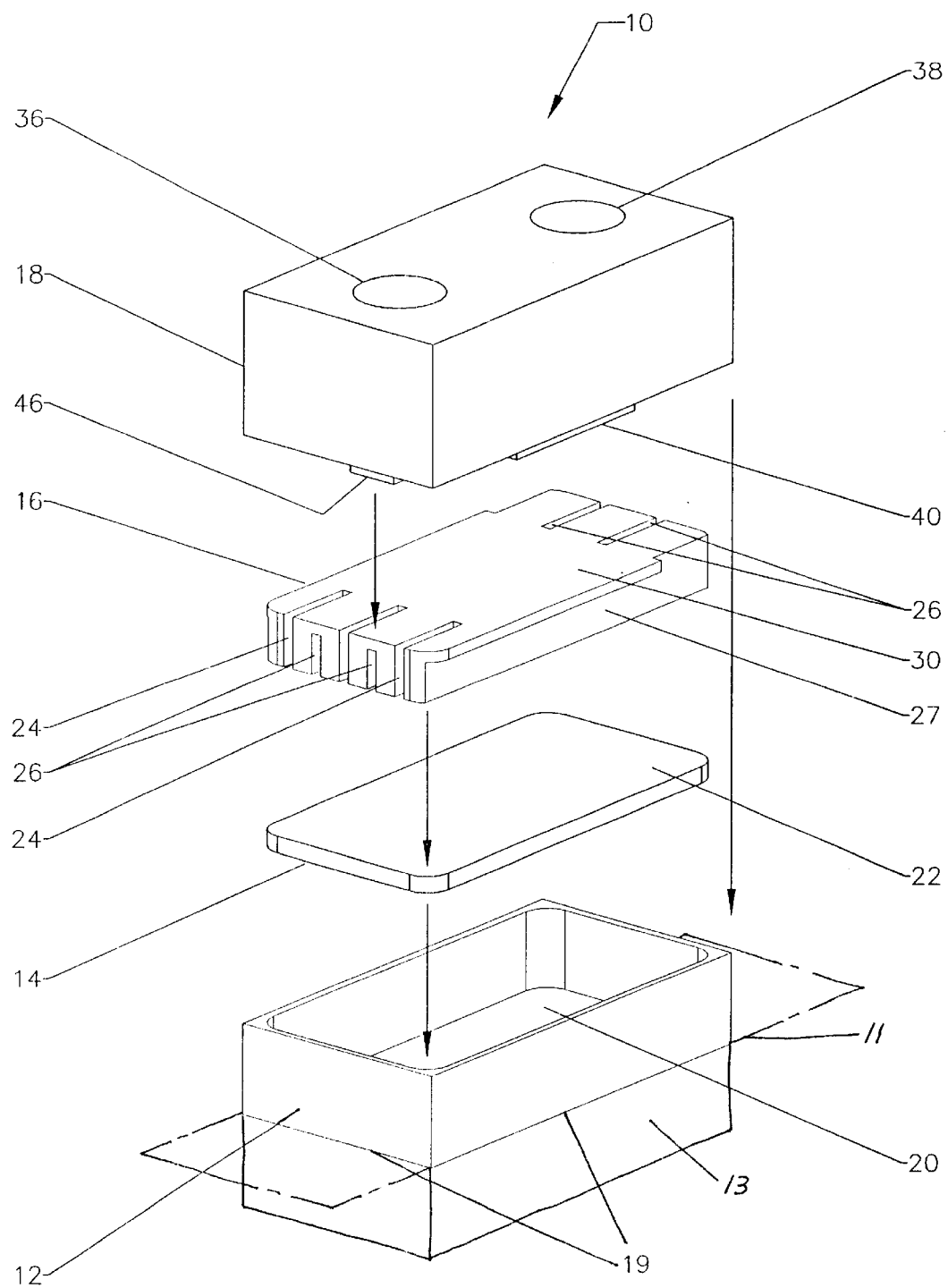
FIG. 2 is an exploded perspective view of one identical half of the heat exchanger of the preferred embodiment of the invention with the pan of the second half shown on the opposite side of a center plane.

FIG. 2 is an exploded perspective view of one identical half of heat exchanger 10 of the preferred embodiment of the invention with only pan 13 of the second half shown on the opposite side of center plane 11. Each half of heat exchanger 10 is constructed with only four major parts, pan 12, porous pad 14, manifold block 16, and lid 18.

Pans 12 and 13 function as the casing of heat exchanger 10, and in the preferred embodiment the pans are shaped generally as rectangular prisms with slightly rounded internal corners, although the shape of the enclosed volume of pans 12 and 13 is not critical. Bottom 20 is a thin solid structure and is the surface which is placed into a heat transfer relationship with the bottom of pan 13 of the other half of heat exchanger 10. Bottom 20 should therefore be a good heat conductor, and a 0.4 mm thick copper sheet is used in the preferred embodiment.

However, depending upon the application in which heat exchanger 10 is to be used, a further advantage can be derived from using a single part as a common bottom 20 for pans 12 and 13 of both halves of the heat exchanger. In such a structure, the only obvious difference from the structure of FIG. 2 is the absence of boundary line 19 between between pans 12 and 13. Such an arrangement eliminates the thermal resistance of the interface between the two pans, and it also eliminates the thermal resistance contributed by the conduction across one of two thicknesses of conventional metal bottom 20.

Porous pad 14 covers the entire interior bottom 20 of its related pan. Porous pad 14 is thin enough so that virtually all the fluid flowing through it is affected by the heat flowing through bottom 20 of pan 12. In the preferred embodiment pad 14 is 0.8 mm thick and constructed of sintered copper powder with a grain size in the range between 0.21 mm and 0.25 mm. Pad 14 is constructed with a 60 percent density of copper. In order to assure good heat transfer, porous pad 14 is bonded to the inner surface of pan bottom 20. In the preferred embodiment this bond is accomplished by brazing, but it is also practical to sinter the porous pad directly onto the bottom surface, and other bonding methods are also possible.

Figure 3:
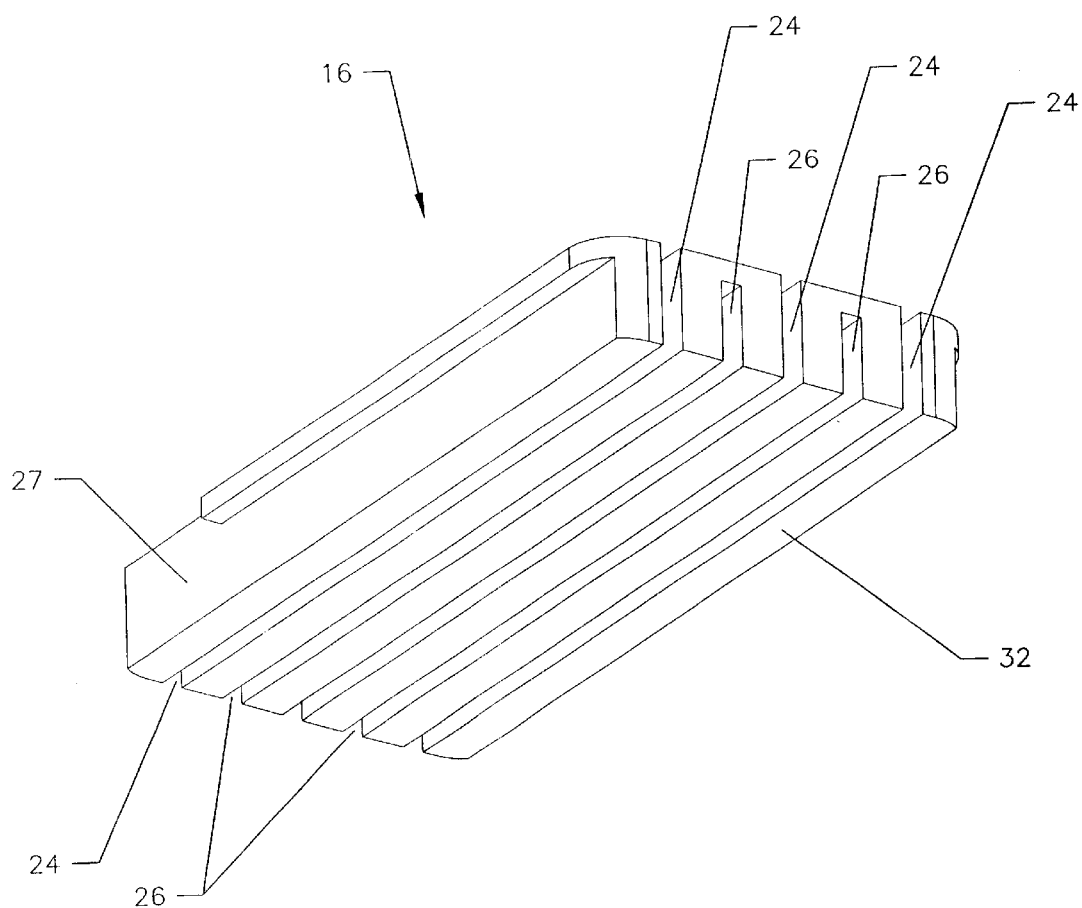
FIG. 3 is a perspective view of the manifold block of each half of the preferred embodiment of the invention showing the side with the channels.

The fluid flowing through pad 14 essentially flows in paths parallel to the plane of pad 14 because of the configuration of manifold block 16. FIG. 3 is a perspective view of manifold blocks 16 of heat exchanger 10 showing surface 32 with channels 24 and 26. Surface 32 is the surface of manifold block 16 opposite from surface 30 seen in FIG. 2. Surface 32 of manifold block 16 contacts surface 22 of porous pad 14 which is opposite from the surface of pad 14 which is in contact with the inner surface of bottom 20 of pan 12. When installed in pan 12 the entire lengths of multiple channels 24 and 26 which are formed within manifold block 16 all open onto surface 22 of pad 14.

The two sets of channels, 24 and 26, are composed of alternating channels, and, as seen in FIG. 2, the sets of channels open onto opposite ends of surface 30 of manifold block 16. When manifold block 16 is installed into pan 12 all the vertical openings of both sets of the channels are closed off. Thus, adjacent channels are isolated from each other and are connected only to openings at opposite ends of surface 30 of manifold block 16. It should also be appreciated that long sides 27 of manifold block 16 also form additional channels for set 26 once manifold block 16 is inserted into pan 12 because the long sides of pan 12 form one wall of each of these channels.

Figure 4:
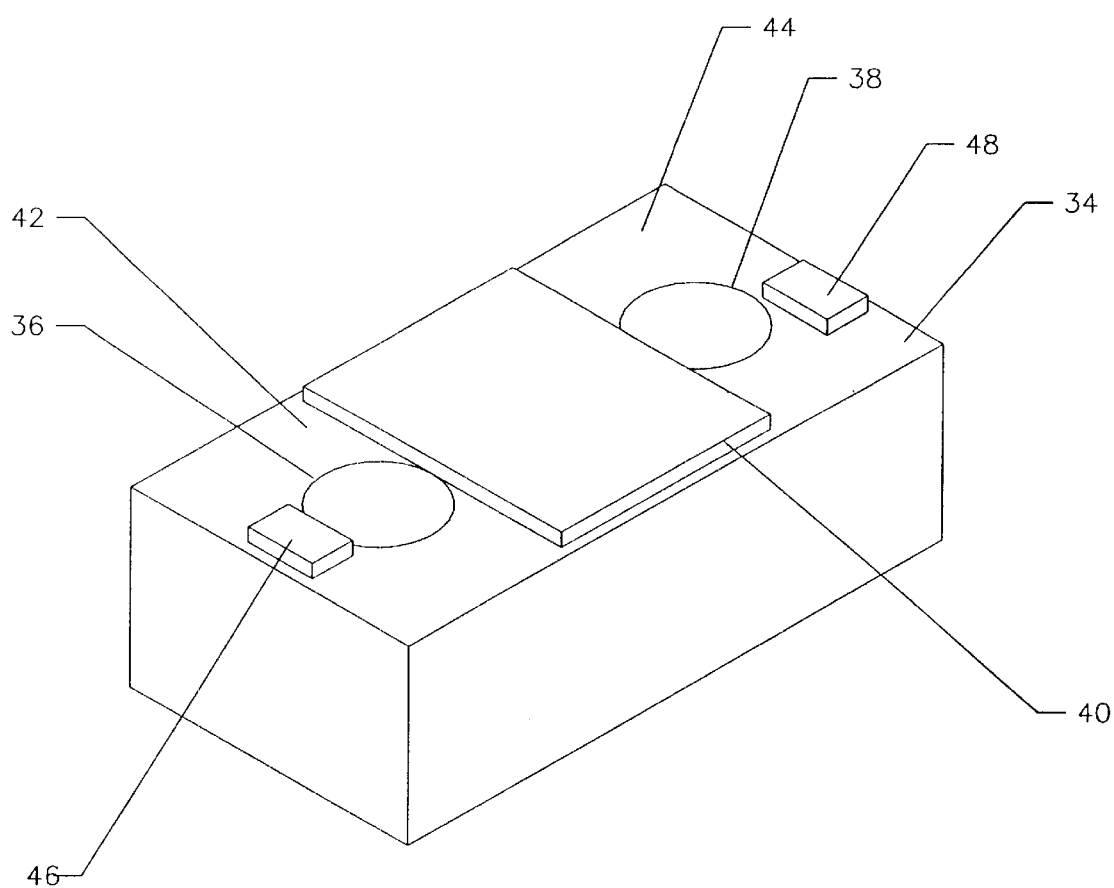
FIG. 4 is a perspective view of the lid of each half of the preferred embodiment of the invention showing the surface which contacts the manifold block.

FIG. 4 is a perspective view of lid 18 of the preferred embodiment of heat exchanger 10 showing surface 34 which faces manifold block 16 when heat exchanger 10 is assembled. Lid 18 includes fluid access holes 36 and 38, each of which connects to one of two isolated chambers 42 and 44 formed when lid 18 is assembled into heat exchanger 10. Barrier 40 both spaces lid 18 from surface 30 of manifold block 16 to form chambers 42 and 44 and isolates the two chambers from each other. Spacers 46 and 48 are also attached to surface 34 of lid 18 to stabilize lid 18.

When heat exchanger 10 is assembled by moving and bonding two identical sets of parts together as indicated by the directional arrows in FIG. 2, heat exchanger 10 operates in a very simple manner. With fluid fed into either access hole 36 or 38 by pipes (shown in FIG. 1) attached to them by conventional means, fluid entering, for instance, hole 36 enters chamber 42 and then into channels 24. With channels 24 filled with fluid, the fluid pressure pushes fluid through porous pad 14, the only exit from channels 24. The fluid then moves through pad 14 into channels 26, located on both sides of channels 24. Traveling this path, fluid moves through the entire volume of pad 14 and in close thermal contact with bottom 20 of pan 12 to provide excellent heat transfer with bottom 20 which is in contact with the other half of assembled heat exchanger 10. The fluid then exits channels 26 into chamber 44 and out of lid 18 through hole 38. Of course the other half of heat exchanger 10 operates in a similar manner.

Figure 5:
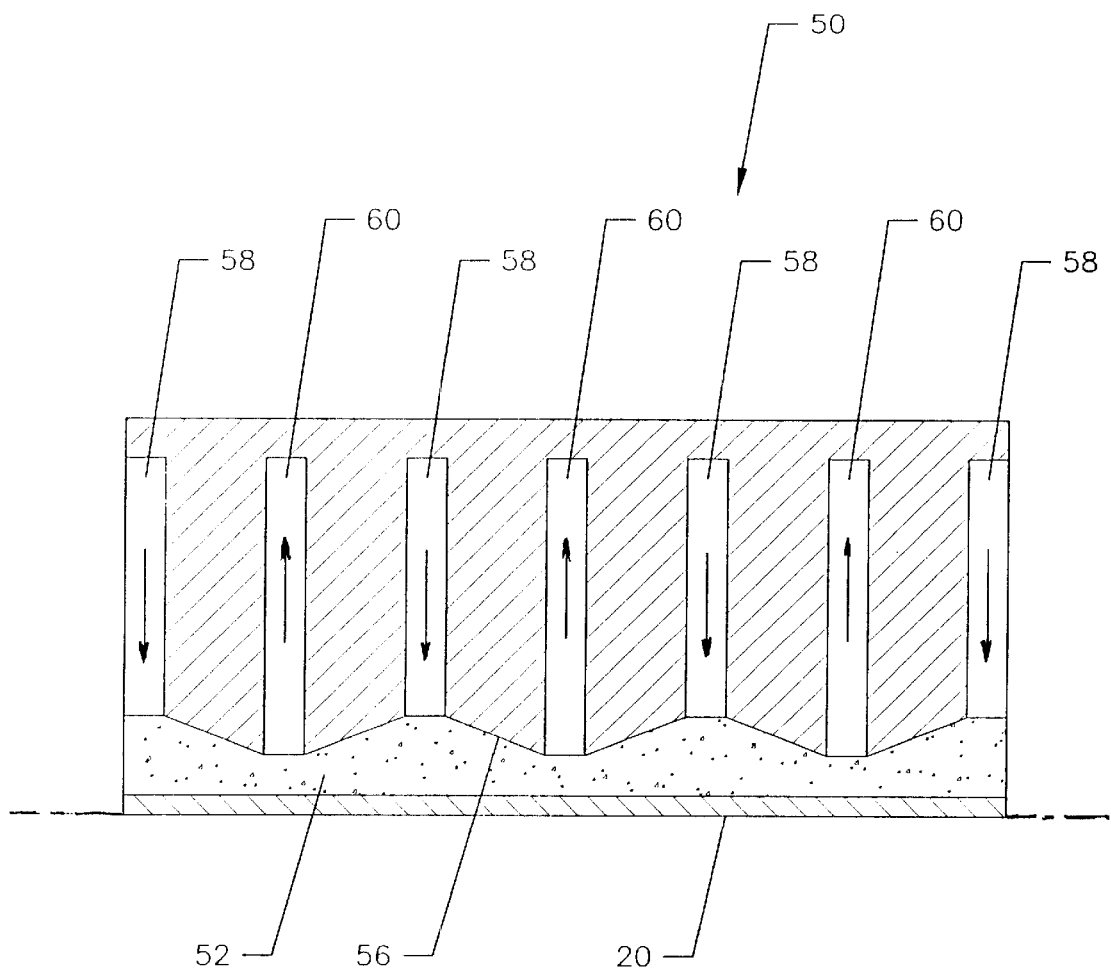
FIG. 5 is a cross section view across the channels of the manifold block of an alternate embodiment of the invention with modifications of the manifold block and porous pad.

FIG. 5 is a cross section view across the channels of an alternate embodiment 50 of the invention with modifications of the manifold block and porous pad which create a more uniform temperature across pan bottom 20. Porous pad 52 and manifold block 54 have mating sawtooth shaped surfaces at junction 56, and this configuration creates variations in the thickness of porous pad 52. Thus, as indicated by the arrows, liquid flows into porous pad 52 from input channels 58 at the thicker portion of porous pad 52 and out through channels 60 at the thinner portion of porous pad 52.

This variation in the cross section area of the liquid flow path through porous pad 52 causes a variation in the velocity of the liquid flowing through porous pad 52, so that the liquid flow increases velocity as it moves toward output channels 60. This increase in velocity means that when the liquid is coolest, as it enters porous pad 52, it will be moving slowest, and when the liquid is the warmest, as it leaves porous pad 52, it will be moving the fastest. Such an increase in velocity compensates for the poorer heat transfer which would otherwise result because of the smaller temperature difference between the heat source and the cooling liquid near the output, and the variation in the thickness of porous pad 52 thereby provides a more uniform temperature across both pan bottom 20 and the other half of the heat exchanger being cooled.

The heat exchanger of the present invention thereby provides improved heat transfer between two moving fluids although it is constructed of a minimum number of simple parts.

It is to be understood that the form of this invention as shown is merely a preferred embodiment. Various changes may be made in the function and arrangement of parts; equivalent means may be substituted for those illustrated and described; and certain features may be used independently from others without departing from the spirit and scope of the invention as defined in the following claims.

For example various attachment holes and fixtures can be attached to lid 18 or pan 12, and fluid access holes could be located on other surfaces of lid 18. Moreover, porous pad 14 can be constructed with different materials such as ceramic, with different structures such as screen, metal felt, and foamed metal, or with particles bonded together by methods other than sintering.

What is claimed as new and for which Letters Patent of the United States are desired to be secured is:

1. A fluid to fluid heat exchanger comprising:
   two enclosures attached to each other, each with a heat conducting structure in heat transfer relationship with the other enclosure and with each heat conducting structure having a surface within the enclosure;

a porous pad within each enclosure with a surface in contact with the surface of the heat conducting structure which is within the enclosures;

a manifold structure within each enclosure with at least two channels formed in a surface of the manifold which is in contact with the porous pad and the channels are divided into at least two sets so that adjacent channels are in different sets;

at least two fluid access means located within each enclosure, separated from each other, and each interconnected to a different set of channels;

a lid attached to each enclosure, the lid including a first fluid access hole and a second fluid access hole into the enclosure, with each hole interconnected with a different fluid access means; and fluid furnished to e ac h first fluid access hole and flowing into a first fluid access means, through a first set of channels, through the porous pad to a second set of channels, through the second set of channels, through a second fluid access means, and out a second fluid access hole.

2. The heat exchanger of claim 1 wherein the enclosures are shaped as pans.

3. The heat exchanger of claim 1 wherein the enclosures are shaped as pans and each heat conducting structure forms the bottom of a pan.

4. The heat exchanger of claim 1 wherein the heat conducting structures of both enclosures are formed together as a single piece.

5. The heat exchanger of claim 1 wherein the heat conducting structures are constructed of copper.

6. The heat exchanger of claim 1 wherein the porous pads are planar structures.

7. The heat exchanger of claim 1 wherein the porous pads are constructed of a thermally conductive material.

8. The heat exchanger of claim 1 wherein the porous pads are constructed of sintered metal powder.

9. The heat exchanger of claim 1 wherein the porous pads are constructed of sintered copper powder.

10. The heat exchanger of claim 1 wherein the porous pads are bonded to the heat conducting structures.

11. The heat exchanger of claim 1 wherein the porous pads are constructed with a reduction of cross sectional area between the fluid input channels and the fluid output channels.

12. The heat exchanger of claim 1 wherein the fluid access means are chambers separated by barrier means located between the manifold structure and the lid, and the barrier means separates the manifold structure from the lid.

13. The heat exchanger of claim 1 wherein the fluid access holes are located in the surfaces of the lids opposite from the fluid access means.

14. The heat exchanger of claim 1 wherein the channels within the manifold structures are parallel to each other.

* * * * *